(12) United States Patent
Kuntzman et al.

(10) Patent No.: US 11,780,726 B2
(45) Date of Patent: Oct. 10, 2023

(54) DUAL-DIAPHRAGM ASSEMBLY HAVING CENTER CONSTRAINT

(71) Applicant: Knowles Electronics, LLC, Itasca, IL (US)

(72) Inventors: Michael Kuntzman, Chicago, IL (US); Michael Pedersen, Long Grove, IL (US); Faisal Zaman, Naperville, IL (US); Xin Song, Carol Stream, IL (US); Vahid Naderyan, Chicago, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 105 days.

(21) Appl. No.: 17/518,350

(22) Filed: Nov. 3, 2021

(65) Prior Publication Data

US 2023/0134752 A1 May 4, 2023

(51) Int. Cl.
*B81B 3/00* (2006.01)
*H04R 7/12* (2006.01)

(52) U.S. Cl.
CPC .......... *B81B 3/0021* (2013.01); *H04R 7/125* (2013.01); *B81B 2201/0257* (2013.01); *B81B 2203/0127* (2013.01); *B81B 2203/0361* (2013.01); *B81B 2203/04* (2013.01); *H04R 2201/003* (2013.01)

(58) Field of Classification Search
CPC .............. H04R 2201/003; H04R 7/125; B81B 2201/0257
See application file for complete search history.

(56) References Cited

U.S. PATENT DOCUMENTS

| | | | |
|---|---|---|---|
| 4,154,115 A | 5/1979 | Hartung et al. |
| 4,435,986 A | 3/1984 | Choffat |
| 6,075,867 A | 6/2000 | Bay et al. |
| 6,431,003 B1 | 8/2002 | Stark et al. |
| 6,435,033 B2 | 8/2002 | Delaye |
| 6,535,460 B2 | 3/2003 | Loeppert et al. |
| 6,571,445 B2 | 6/2003 | Ladabaum |
| 6,662,663 B2 | 12/2003 | Chen |
| 7,030,407 B2 | 4/2006 | Michler |
| 7,040,173 B2 | 5/2006 | Dehe |

(Continued)

FOREIGN PATENT DOCUMENTS

| | | |
|---|---|---|
| CN | 103344377 A | 10/2013 |
| KR | 100571967 B1 | 4/2006 |
| WO | 2012085335 A1 | 6/2012 |

OTHER PUBLICATIONS

Andrews et al., "A comparison of squeeze-film theory with measurements on a microstructure," Sensors and Actuators A 36 (1993) 79-87, 9 pages.

(Continued)

*Primary Examiner* — Sunita Joshi
(74) *Attorney, Agent, or Firm* — FLENER IP & BUSINESS LAW; Zareefa B. Flener; Ayhan E. Mertogul

(57) ABSTRACT

A MEMS diaphragm assembly comprises a first diaphragm, a second diaphragm, and a stationary electrode assembly spaced between the first and second diaphragms and including a plurality of apertures disposed therethrough. Each of a plurality of pillars is disposed through one of the plurality of apertures and connects the first and second diaphragms. At least one of the first and second diaphragms is connected to the stationary electrode assembly at a geometric center of the assembly.

20 Claims, 8 Drawing Sheets

(56) References Cited

U.S. PATENT DOCUMENTS

| | | |
|---|---|---|
| 7,124,638 B2 | 10/2006 | Kandler |
| 7,150,195 B2 | 12/2006 | Jacobsen et al. |
| 7,190,038 B2 | 3/2007 | Dehe et al. |
| 7,470,546 B2 | 12/2008 | Lehmann |
| 7,489,593 B2 | 2/2009 | Nguyen-Dinh et al. |
| 7,535,156 B2 | 5/2009 | Kvisteroy et al. |
| 7,545,012 B2 | 6/2009 | Smith et al. |
| 7,781,249 B2 | 8/2010 | Laming et al. |
| 7,793,550 B2 | 9/2010 | Elian et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,903,831 B2 | 3/2011 | Song |
| 7,918,135 B2 | 4/2011 | Hammerschmidt |
| 8,127,619 B2 | 3/2012 | Hammerschmidt |
| 8,339,764 B2 | 12/2012 | Steeneken et al. |
| 8,461,655 B2 | 6/2013 | Klein et al. |
| 8,575,037 B2 | 11/2013 | Friza et al. |
| 8,650,963 B2 | 2/2014 | Barr et al. |
| 8,723,277 B2 | 5/2014 | Dehe et al. |
| 8,809,973 B2 | 8/2014 | Theuss |
| 8,969,980 B2 | 3/2015 | Lee |
| 8,989,411 B2 | 3/2015 | Hall et al. |
| 9,031,266 B2 | 5/2015 | Dehe et al. |
| 9,179,221 B2 | 11/2015 | Barzen et al. |
| 9,181,080 B2 | 11/2015 | Dehe et al. |
| 9,237,402 B2 | 1/2016 | Loeppert |
| 9,321,630 B2 | 4/2016 | Xu et al. |
| 9,332,330 B2 | 5/2016 | Elian et al. |
| 9,380,381 B2 | 6/2016 | Straeussnigg et al. |
| 9,383,282 B2 | 7/2016 | Besling et al. |
| 9,383,285 B2 | 7/2016 | Phan Le et al. |
| 9,425,757 B2 | 8/2016 | Straeussnigg et al. |
| 9,432,759 B2 | 8/2016 | Elian et al. |
| 9,438,979 B2 | 9/2016 | Dehe |
| 9,510,107 B2 | 11/2016 | Dehe et al. |
| 9,516,428 B2 | 12/2016 | Dehe et al. |
| 9,549,263 B2 | 1/2017 | Uchida |
| 9,550,211 B2 | 1/2017 | Dirksen et al. |
| 9,631,996 B2 | 4/2017 | Wiesbauer et al. |
| 9,689,770 B2 | 6/2017 | Hammerschmidt |
| 9,828,237 B2 | 11/2017 | Walther et al. |
| 9,884,757 B2 | 2/2018 | Winkler et al. |
| 9,903,779 B2 | 2/2018 | Hammerschmidt |
| 9,942,677 B2 | 4/2018 | Wiesbauer et al. |
| 10,129,676 B2 | 11/2018 | Walther et al. |
| 10,231,061 B2 | 3/2019 | Dehe et al. |
| 10,322,481 B2 | 6/2019 | Dehe et al. |
| 10,433,070 B2 | 10/2019 | Dehe et al. |
| 10,560,771 B2 | 2/2020 | Dehe et al. |
| 10,582,306 B2 | 3/2020 | Dehe |
| 10,589,990 B2 | 3/2020 | Dehe et al. |
| 10,641,626 B2 | 5/2020 | Bretthauer et al. |
| 10,669,151 B2 | 6/2020 | Strasser et al. |
| 10,676,346 B2 | 6/2020 | Walther et al. |
| 10,689,250 B2 | 6/2020 | Fueldner et al. |
| 10,715,926 B2 | 7/2020 | Bretthauer et al. |
| 10,939,214 B2 | 3/2021 | Kuntzman et al. |
| 2005/0177045 A1 | 8/2005 | Degertekin et al. |
| 2005/0207605 A1 | 9/2005 | Dehe et al. |
| 2005/0219953 A1 | 10/2005 | Bayram et al. |
| 2007/0205492 A1 | 9/2007 | Wang |
| 2007/0278501 A1 | 12/2007 | Macpherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0170346 A1 | 7/2010 | Opitz et al. |
| 2010/0173437 A1 | 7/2010 | Wygant et al. |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0001550 A1 | 1/2013 | Seeger et al. |
| 2014/0071642 A1 | 3/2014 | Theuss |
| 2015/0090043 A1 | 4/2015 | Ruhl et al. |
| 2015/0247879 A1 | 9/2015 | Meinhold |
| 2015/0296307 A1 | 10/2015 | Shao et al. |
| 2016/0096726 A1 | 4/2016 | Dehe et al. |
| 2018/0091906 A1 | 3/2018 | Khenkin et al. |
| 2018/0234774 A1 | 8/2018 | Walther et al. |
| 2018/0317022 A1 | 11/2018 | Evans et al. |
| 2019/0112182 A1 | 4/2019 | Metzger-Brueckl et al. |
| 2019/0116429 A1* | 4/2019 | Meisel ............... H04R 19/04 |
| 2019/0181776 A1 | 6/2019 | Tumpold et al. |
| 2019/0246459 A1 | 8/2019 | Tumpold et al. |
| 2019/0270639 A1 | 9/2019 | Lorenz et al. |
| 2019/0331531 A1 | 10/2019 | Glacer et al. |
| 2019/0339193 A1 | 11/2019 | Eberl et al. |
| 2019/0352175 A1 | 11/2019 | Tumpold et al. |
| 2019/0363757 A1 | 11/2019 | Mikolajczak et al. |
| 2020/0057031 A1 | 2/2020 | Theuss et al. |
| 2021/0204048 A1* | 7/2021 | Chandrasekaran ...... H04R 1/04 |

OTHER PUBLICATIONS

Bay et al., "Design of a silicon microphone with differential read-out of a sealed double parallel-plate capacitor," Sensors and Acutators A 53 (1996), pp. 232-236, 5 pages.

Hansen et al., "Wideband micromachined capacitive microphones with radio frequency detection," J. Acoust. Soc. Am. 116 (2), Aug. 2004, pp. 828-842, 15 pages.

Lin, Der-Song, "Interface Engineering of Capacitive Micromachined Ultrasonic Transducers for Medical Applications," A Dissertation Submitted to the Department of Mechanical Engineering and the Committee on Graduate Studies of Stanford University in Partial Fulfillment of the Requirements for the Degree of Doctor of Philosophy, Jun. 2011, 168 pages.

Park et al., "Fabrication of Capacitive Micromachined Ultrasonic Transducers via Local Oxidation and Direct Water Bonding," Journal of Microelectromechanical Systems, vol. 20, No. 1, Feb. 2011, 10 pages.

Krzysztof Iniewski, "Smart Sensors for Industrial Applications," Figure 19. 1, p. 306, 1 page (2013).

Wygant et al., "50 KHz Capacitive Micromachined Ultrasonic Transducers for Generation of Highly Directional Sound with Parametric Arrays," IEEE Transactions on Ultrasonics, Ferroelectrics, and Frequency Control, vol. 56, No. 1, Jan. 2009, pp. 193-203, 11 pages.

* cited by examiner

DUAL-DIAPHRAGM ASSEMBLY HAVING CENTER CONSTRAINT

FIELD OF THE DISCLOSURE

The present disclosure relates generally to a microelectromechanical systems (MEMS) dual-diaphragm assembly, and more particularly to a MEMS dual-diaphragm assembly having a center constraint.

BACKGROUND

It is known that in the fabrication of MEMS devices often a plurality of devices are manufactured in a single batch process wherein individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes use as an acoustic transducer or other portion of a microphone.

Existing vacuum sealed MEMS dual-diaphragm assemblies including a stationary electrode assembly disposed between first and second diaphragms do not include a center constraint. The lack of a center constraint can result in a mismatch in gap spacing between each of the first and second diaphragms and the stationary electrode assembly, and such a mismatched gap spacing is detrimental to performance. Conversely, it has been demonstrated that adding a center constraint reduces both the mean and variation in the static deflection of the assembly, which improves the gap matching. Further benefits of adding a center constraint include reducing the damping for a given cavity pressure, which increases the backplate resonance frequency thereby reducing the effect of ringing, and increasing the effective area of the assembly, which allows the same sensitivity to be achieved with lower compliance, resulting in better linearity and lower total harmonic distortion (THD). A need therefore exists for a vacuum sealed MEMS dual-diaphragm assembly having a center constraint.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

Figure 1:
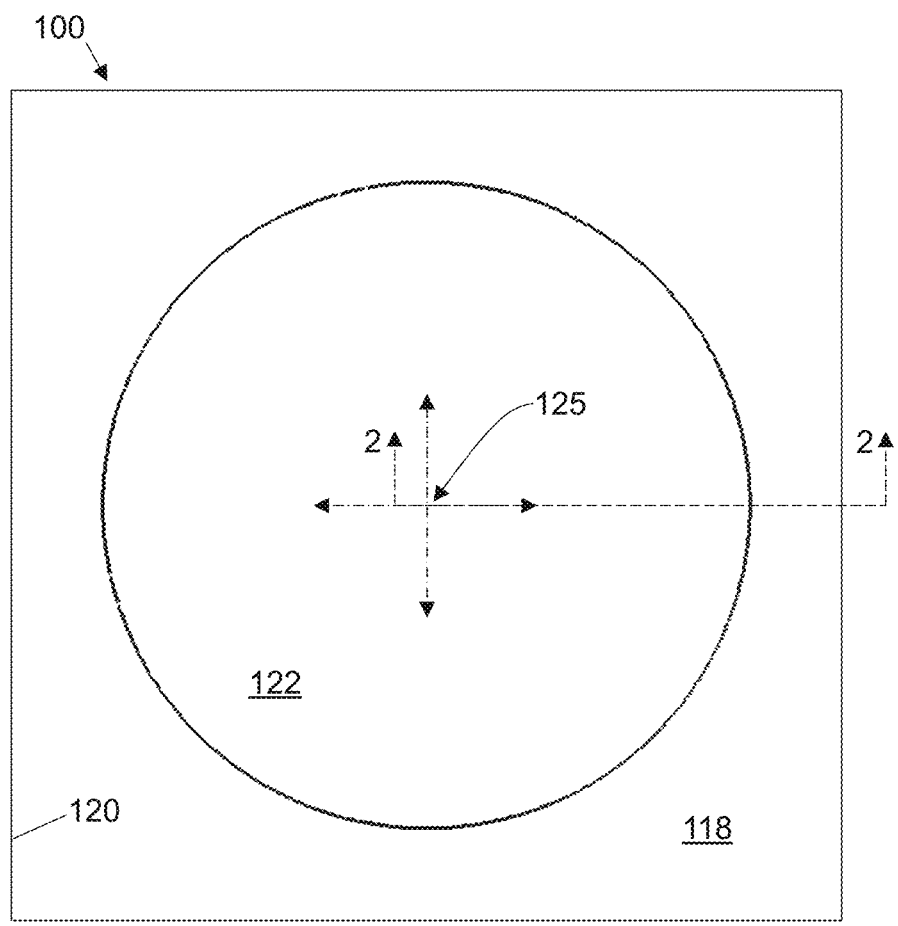
FIG. 1 is a top plan schematic view of a MEMS die, according to an embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

According to an embodiment, a MEMS diaphragm assembly comprises a first diaphragm, a second diaphragm, and a stationary electrode assembly spaced between the first and second diaphragms and including a plurality of apertures disposed therethrough. Each of a plurality of pillars is disposed through one of the plurality of apertures and connects the first and second diaphragms. At least one of the first and second diaphragms is connected to the stationary electrode assembly at a geometric center of the assembly.

According to an embodiment, both of the first and second diaphragms are connected to the stationary electrode assembly at the geometric center of the assembly. According to an embodiment, the at least one of the first and second diaphragms is connected to the stationary electrode assembly at a geometric center of the assembly by an electrically insulative material. According to an embodiment, the at least one of the first and second diaphragms is connected to the stationary electrode assembly at a geometric center of the assembly by an electrically conductive material. According to an embodiment, the at least a portion of the at least one of the first and second diaphragms is connected directly to the stationary electrode assembly.

According to an embodiment the first diaphragm and the second diaphragm bound a sealed chamber, and the pressure within the sealed chamber is below atmospheric pressure. According to another embodiment at least one tunnel passes through the first and second diaphragms and the stationary electrode assembly, wherein the at least one tunnel is sealed off from the sealed chamber. In an embodiment the at least one tunnel is sealed off from the sealed chamber and passes through the sealed chamber, and in another embodiment the at least one tunnel is sealed off from the sealed chamber and passes through the geometric center of the assembly.

According to an embodiment, a microphone device comprises a MEMS die comprising a substrate having an opening formed therethrough, and a diaphragm assembly attached around a periphery thereof to the substrate and over the opening. The diaphragm assembly comprises a first diaphragm, a second diaphragm, and a stationary electrode assembly spaced between the first and second diaphragms and including a plurality of apertures disposed therethrough. Each of a plurality of pillars is disposed through one of the plurality of apertures and connects the first and second diaphragms, wherein at least one of the first and second diaphragms is connected to the stationary electrode assembly at a geometric center of the assembly. In another embodiment at least a portion of the at least one of the first and second diaphragms is connected directly to the stationary electrode assembly. In a further embodiment the one of the first and second diaphragms having at least a portion thereof connected directly to the stationary electrode assembly is the one of the first and second diaphragms disposed on a side of the diaphragm assembly away from the opening.

Figure 2A:
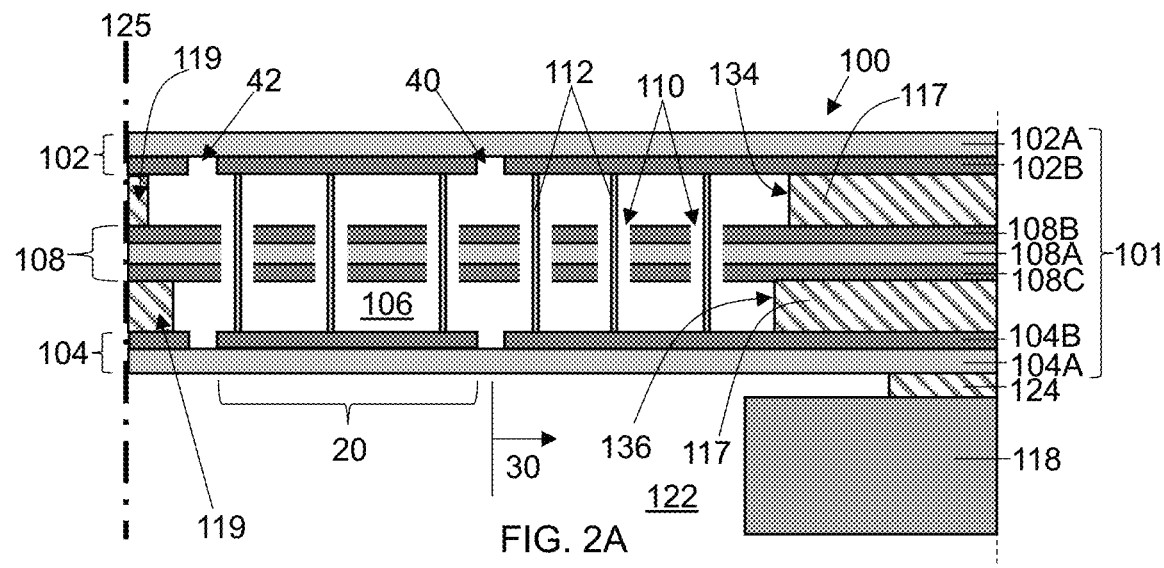
FIG. 2A is a cross-sectional schematic view of the MEMS die of FIG. 1 taken generally along the lines 2-2 of FIG. 1.

Referring to FIGS. 1 and 2A, an exemplary MEMS die 100 is shown schematically in a top plan view in FIG. 1. FIG. 2A illustrates a cross-sectional view taken generally along the lines 2-2 of FIG. 1. In an embodiment the MEMS die 100 includes a first diaphragm 102 and a second diaphragm 104. The first diaphragm 102 and the second diaphragm 104 bound a sealed chamber 106. A stationary electrode assembly 108 is disposed within the sealed chamber 106 between the first diaphragm 102 and the second diaphragm 104.

Referring to FIGS. 1 and 2A, in an embodiment the MEMS die 100 includes a substrate 118 having an outer boundary 120 as indicated in FIG. 1. In an embodiment the substrate 118 has a generally rectangular perimeter, but in other embodiments it can be any shape. The substrate 118 in an embodiment includes an opening 122 formed therethrough. The geometric center 125 of the MEMS die 100 is also illustrated at an intersection of crossed centerlines in FIG. 1 and at the left side of the cross-sectional view of FIG. 2A. In an embodiment the first and second diaphragms 102, 104 extend over the entire substrate 118. In other embodiments the first and second diaphragms 102, 104 extend over a portion but not all of the substrate 118.

Referring to FIG. 2A, in an embodiment a MEMS diaphragm assembly 101 comprises the first diaphragm 102, the second diaphragm 104, and the stationary electrode assembly 108 spaced between the first and second diaphragms 102, 104 and including a plurality of apertures 110 disposed therethrough. A plurality of pillars 112, each disposed through one of the plurality of apertures 110, connects the first and second diaphragms 102, 104. In an embodiment the MEMS diaphragm assembly 101 is attached around the outer periphery thereof to the substrate 118 and over the opening 122.

In an embodiment the MEMS diaphragm assembly 101 is attached to the substrate 118 via the second diaphragm 104 over the opening 122 via a spacer layer 124. However, in other embodiments at least a portion of the second diaphragm 104 is attached directly to the substrate 118. In some embodiments the spacer layer 124 can be an integral part of the substrate 118 or added onto the substrate 118 as an additional sacrificial layer 124. The spacer layer 124 can, for example, be made of any insulative material as described hereinbelow. In an embodiment the substrate 118 is made of silicon.

According to an embodiment, the first diaphragm 102 includes an insulative layer 102A and a conductive layer 102B, and the second diaphragm 104 includes an insulative layer 104A and a conductive layer 104B. Each of the conductive layers 102B and 104B includes a sensing or electrically active region 20 and a non-sensing or electrically inactive region 30. The sensing region 20 is disposed radially inward of and separated from the non-sensing region 30 by a first gap 40 in the conductive layer 102B or 104B. In embodiments having a connection between the conductive layer 102B or 104B and the stationary electrode assembly 108 (or directly between the first and second conductive layers 102B, 104B), the sensing region 20 is further separated from the connection by a second gap 42. The sensing region 20, the non-sensing region 30, and the gaps 40, 42 are illustrated in FIGS. 2A-4 and 9-11. The sensing region 20 of the conductive layer 102B of the first diaphragm 102 may be referred to as a first movable electrode. Similarly, the sensing region 20 of the conductive layer 104B of the second diaphragm 104 may be referred to as a second movable electrode.

Figure 2B:
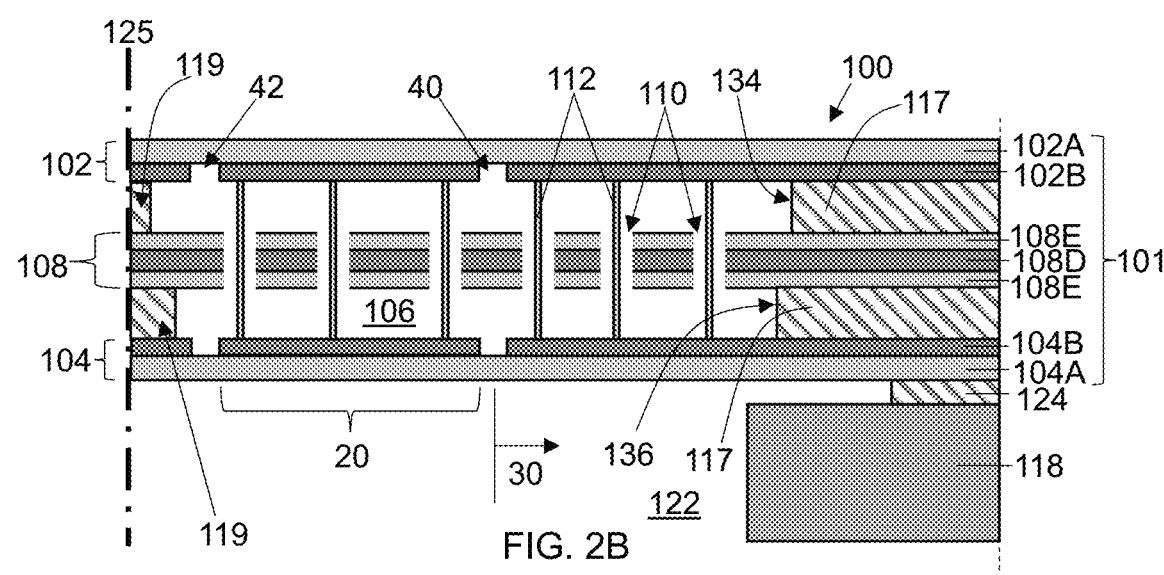
FIG. 2B is a cross-sectional schematic view of another embodiment of the MEMS die of FIG. 1 taken generally along the lines 2-2 of FIG. 1.

Still referring to FIG. 2A, according to an embodiment, the stationary electrode assembly 108 includes an insulative layer 108A, a first conductive layer 108B, and a second conductive layer 108C. The insulative layer 108A is sandwiched between the first conductive layer 108B and the second conductive layer 108C. In one embodiment, the first conductive layer 108B and the second conductive layer 108C are shorted together so as to form a single electrode (also referred to herein as a stationary electrode), which faces the first movable electrode and also faces the second movable electrode. In another embodiment, the first conductive layer 108B and the second conductive layer 108C are electrically isolated from one another, and may be respectively referred to as a first stationary electrode (which faces the first movable electrode) and a second stationary electrode (which faces the second movable electrode). In an embodiment, the stationary electrode assembly 108 is relatively thick and/or stiff compared to the first and second diaphragms 102 and 104, for example by being fabricated using thicker materials or using thin very high stress films to maintain sufficient rigidity. The stationary electrode assembly 108 remains relatively motionless when the first and second diaphragms 102 and 104 are deflected. Referring to FIG. 2B, in another embodiment the stationary electrode assembly 108 includes a single conductive layer 108D surrounded by two dielectric layers 108E, where the single conductive layer 108D is sandwiched between the two dielectric layers 108E.

Referring to FIGS. 2A and 2B, in an embodiment a mechanically active area for the first diaphragm 102 is defined by an annular region bounded at an outer radius by the innermost radial boundary (the release front 134) of material 117 disposed between the stationary electrode assembly 108 and the first diaphragm 102, and at an inner radius by the outermost radial boundary of the connection between the first diaphragm 102 and the stationary electrode assembly 108. Similarly, in an embodiment a mechanically active area for the second diaphragm 104 is defined by an annular region bounded at an outer radius by the innermost radial boundary (the release front 136) of material 117 disposed between the stationary electrode assembly 108 and the second diaphragm 104, and at an inner radius by the outermost radial boundary of the connection between the second diaphragm 104 and the stationary electrode assembly 108. In an embodiment, the material 117 disposed between the stationary electrode assembly 108 and each of the first and second diaphragms 102, 104 can be a sacrificial material and/or can, for example, be made of any insulative material as described hereinbelow.

The material of any of the insulative layers 102A, 104A, and 108A can be any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof. Similarly, the material of any of the conductive layers 102B, 104B, 108B, and 108C can be any conductive material that would not be damaged during a sacrificial layer removal process. For example, without limitation, the conductive material can be polycrystalline silicon, one or more metals, alloys of metals, carbon, materials that are not damaged by a sacrificial layer removal process, and combinations thereof. The structural geometry of materials comprising the first and second diaphragms 102 and 104 and the stationary electrode assembly 108 can be other than those described hereinabove in other embodiments.

Figure 3:
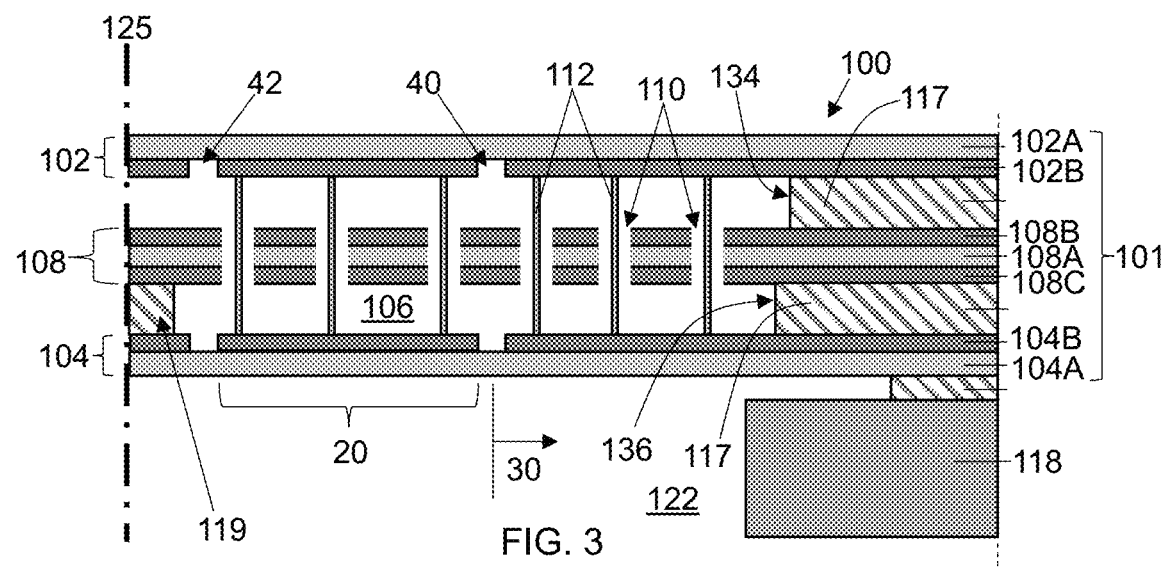
FIG. 3 is a cross-sectional schematic view of a MEMS die, according to another embodiment.
Figure 4:
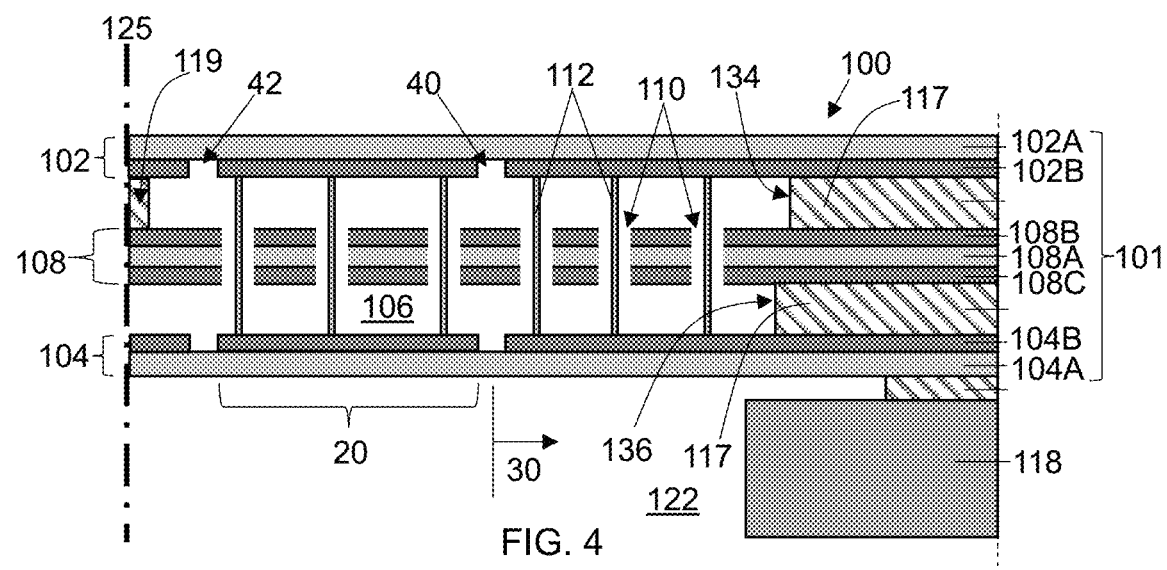
FIG. 4 is a cross-sectional schematic view of a MEMS die, according to yet another embodiment.

Referring now to FIGS. 2A-4, in various embodiments at least one of the first and second diaphragms 102, 104 is connected to the stationary electrode assembly 108 at the geometric center 125 of the assembly 101. For example, FIGS. 2A and 2B illustrate an embodiment wherein both of the first and second diaphragms 102, 104 are connected to the stationary electrode assembly 108 at the geometric center 125 of the assembly 101. FIG. 3 illustrates an embodiment wherein the second diaphragm 104 is connected to the stationary electrode assembly 108 at the geometric center 125 of the assembly 101, and FIG. 4 illustrates an embodiment wherein the first diaphragm 102 is connected to the stationary electrode assembly 108 at the geometric center 125 of the assembly 101.

The connection between the at least one of the first and second diaphragms 102, 104 and the stationary electrode assembly 108 can be via a direct connection, or via a connecting material 119 as illustrated in FIGS. 2A-4. The connecting material 119 can be either an electrically insulative material or an electrically conductive material. It is envisioned that in an embodiment where both of the first and second diaphragms 102, 104 are connected to the stationary electrode assembly 108 that one of the connections could be via an insulative material and the other of the connections could be via a conductive material. In an embodiment the connection between the at least one of the first and second diaphragms 102, 104 and the stationary electrode assembly 108 can be via an electrically insulative material comprising an unreleased sacrificial material 119.

FIGS. 5A-8 are exemplary cross-sectional views of a MEMS diaphragm assembly 101 illustrating a direct connection of at least one of the first and second diaphragms 102, 104 to the stationary electrode assembly 108 or to the other of the first and second electrodes 102, 104 at the geometric center 125 thereof. It is important to note that the first diaphragm 102 and the second diaphragm 104 bound a sealed chamber 106, and the pressure within the sealed chamber 106 is reduced below atmospheric pressure. The sealed chamber 106 in some embodiments is a low pressure region having a pressure below atmospheric pressure. In an embodiment the sealed chamber 106 has an internal pressure, for example, of less than 100,000 Pa. In another embodiment the sealed chamber 106 has an internal pressure of less than 10,000 Pa. In a further embodiment the sealed chamber 106 has an internal pressure of less than 1,000 Pa, and in yet another embodiment the sealed chamber 106 has an internal pressure of less than 100 Pa.

The embodiments shown in FIGS. 5A-8 take advantage of the reduced pressure of the sealed chamber 106 to achieve a direct connection between at least one of the first and second diaphragms 102, 104 and the stationary electrode assembly 108 or a direct connection between the first and second electrodes 102, 104 at the geometric center 125. This direct connection is structurally different than the embodiments having a connection via a connecting material 119.

Figure 5A:
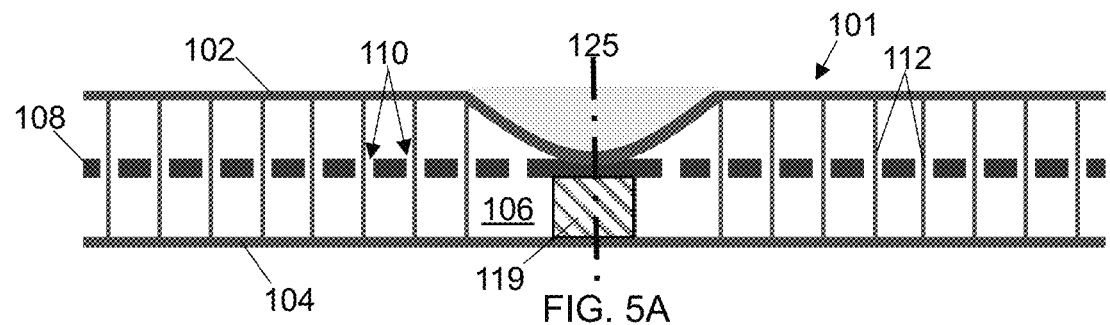
FIG. 5A is a cross-sectional schematic view of a MEMS diaphragm assembly, according to an embodiment.
Figure 5B:
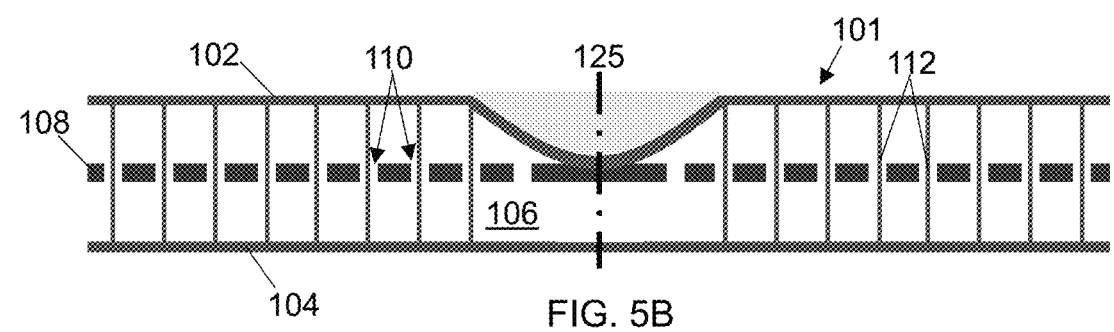
FIG. 5B is a cross-sectional schematic view of a MEMS diaphragm assembly, according to another embodiment.

Referring to FIGS. 5A and 5B, in an embodiment at least a portion of the first diaphragm 102 is connected directly to the stationary electrode assembly 108. In an embodiment as shown in FIG. 5A the second diaphragm 104 is connected to the stationary electrode assembly 108 by a connecting material 119, which can be an electrically insulative material or electrically conductive material. In an embodiment as shown in FIG. 5B the second diaphragm 104 is not connected to the stationary electrode assembly 108.

Figure 6A:
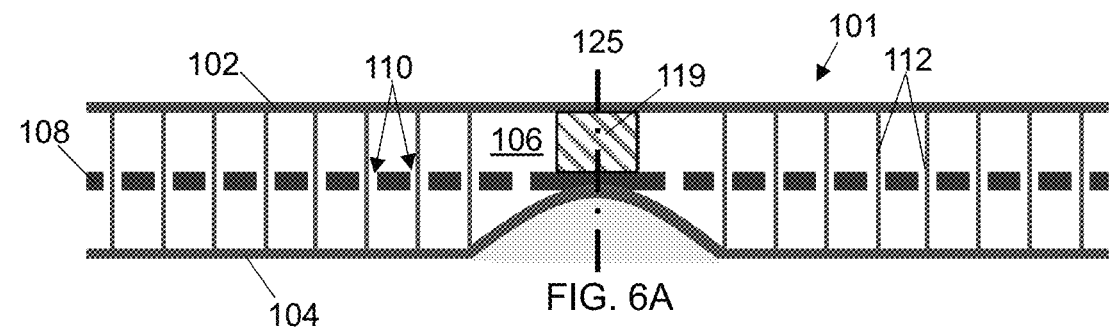
FIG. 6A is a cross-sectional schematic view of a MEMS diaphragm assembly, according to yet another embodiment.
Figure 6B:
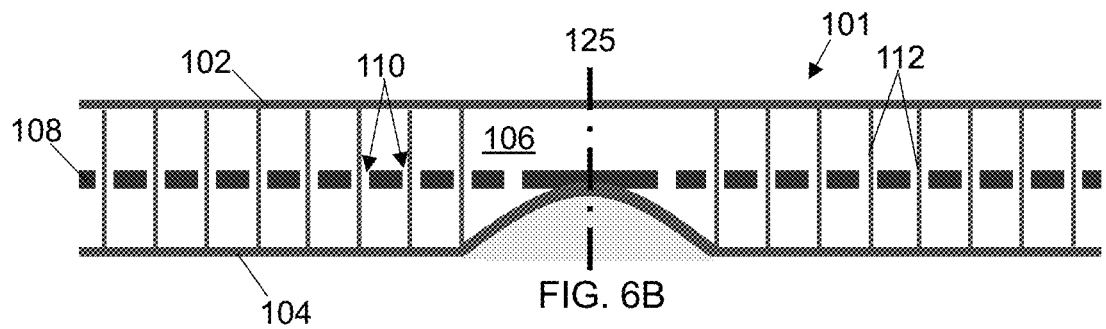
FIG. 6B is a cross-sectional schematic view of a MEMS diaphragm assembly, according to a further embodiment.

Referring to FIGS. 6A and 6B, in an embodiment at least a portion of the second diaphragm 104 is connected directly to the stationary electrode assembly 108. In an embodiment as shown in FIG. 6A the first diaphragm 102 is connected to the stationary electrode assembly 108 by a connecting material 119, which can be an electrically insulative material or electrically conductive material. In an embodiment as shown in FIG. 6B the first diaphragm 102 is not connected to the stationary electrode assembly 108

Figure 7:
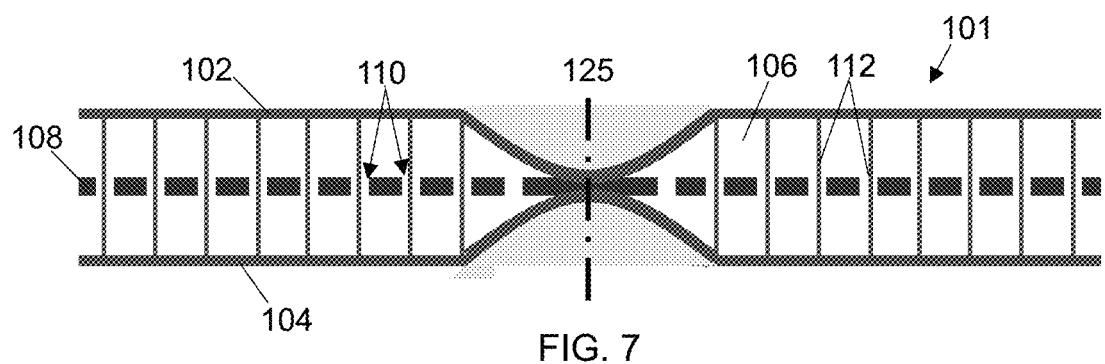
FIG. 7 is a cross-sectional schematic view of a MEMS diaphragm assembly, according to yet another embodiment.

Referring to FIG. 7, in an embodiment, at least a portion of both of the first and second diaphragms 102, 104 is connected directly to the stationary electrode assembly 108.

Figure 8:
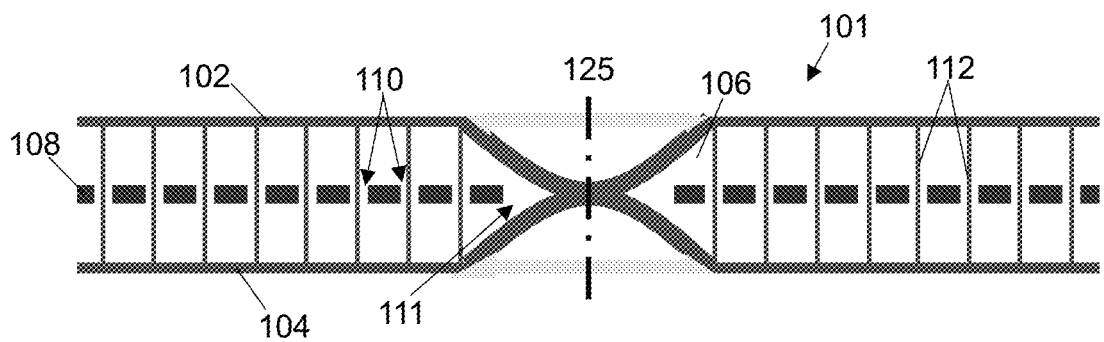
FIG. 8 is a cross-sectional schematic view of a MEMS diaphragm assembly, according to a further embodiment.

Referring to FIG. 8, in an embodiment a MEMS diaphragm assembly 101 comprises first and second diaphragms 102, 104, and a stationary electrode assembly 108 spaced between the first and second diaphragms 102, 104. The stationary electrode assembly 108 includes a plurality of apertures 110 disposed therethrough, the plurality of apertures including a central aperture 111 disposed through a geometric center 125 of the stationary electrode assembly 108. A plurality of pillars 112 is each disposed through one of the plurality of apertures 110 except for the central aperture 111, wherein the plurality of pillars 112 connects the first and second diaphragms 102, 104. In this embodiment the first and second diaphragms 102, 104 are connected directly to one another within the central aperture 111.

It should be noted that there are two different types of direct connection that can be made as described hereinabove in regard to FIGS. 5A-8. As described above, a first type of direct connection between at least one of the first and second diaphragms 102, 104 and the stationary electrode assembly 108, or between the first and second electrodes 102, 104 at the geometric center 125, can be achieved by taking advantage of the reduced pressure of the sealed chamber 106. This type of direct connection uses ambient pressure of the surroundings against the reduced pressure of the sealed chamber 106 to make the direct connection, so that the first and second electrodes 102, 104 are not fabricated to be in contact until sacrificial layers within the chamber 106 are etched away and the resulting chamber 106 is sealed at a pressure below ambient.

This type of direct connection is structurally different than the embodiments having a connection established via a connecting material 119, which are fabricated to have a direct connection by the layering process (as described for FIGS. 2A-4), wherein the layers are deposited directly in contact with each other at the time of layer fabrication.

Figure 9:
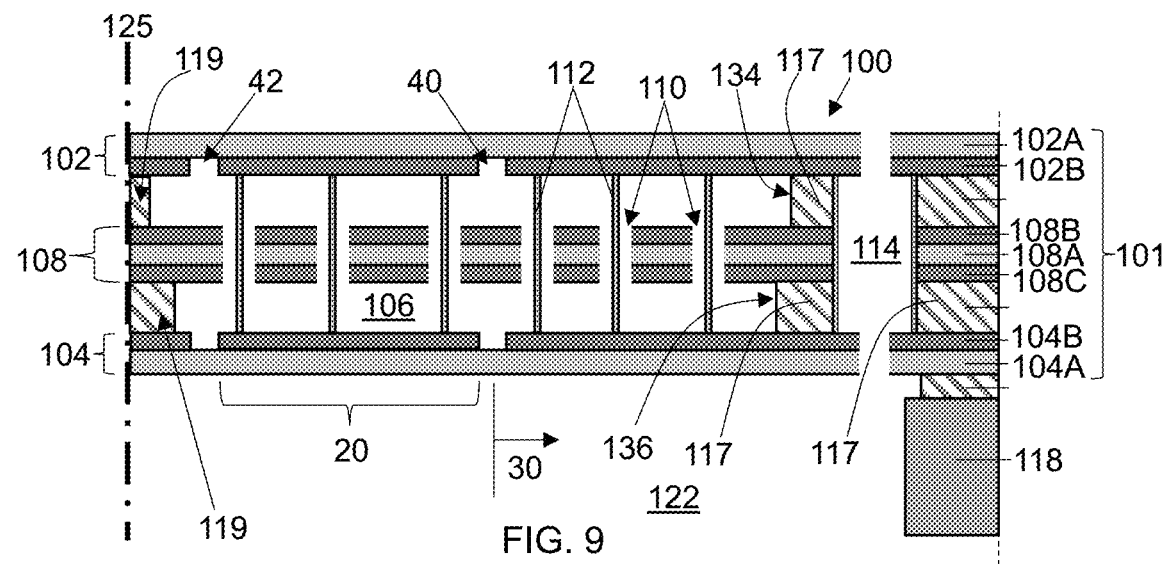
FIG. 9 is a cross-sectional schematic view of a MEMS die including a tunnel disposed through the MEMS diaphragm assembly, according to an embodiment.
Figure 10:
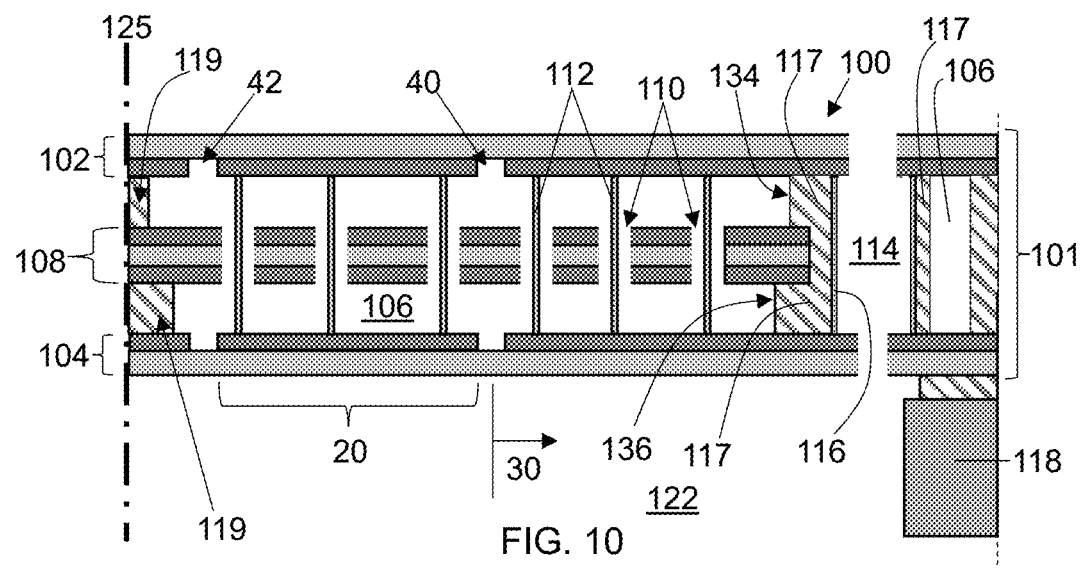
FIG. 10 is a cross-sectional schematic view of a MEMS die including a tunnel disposed through the MEMS diaphragm assembly, according to another embodiment.
Figure 11:
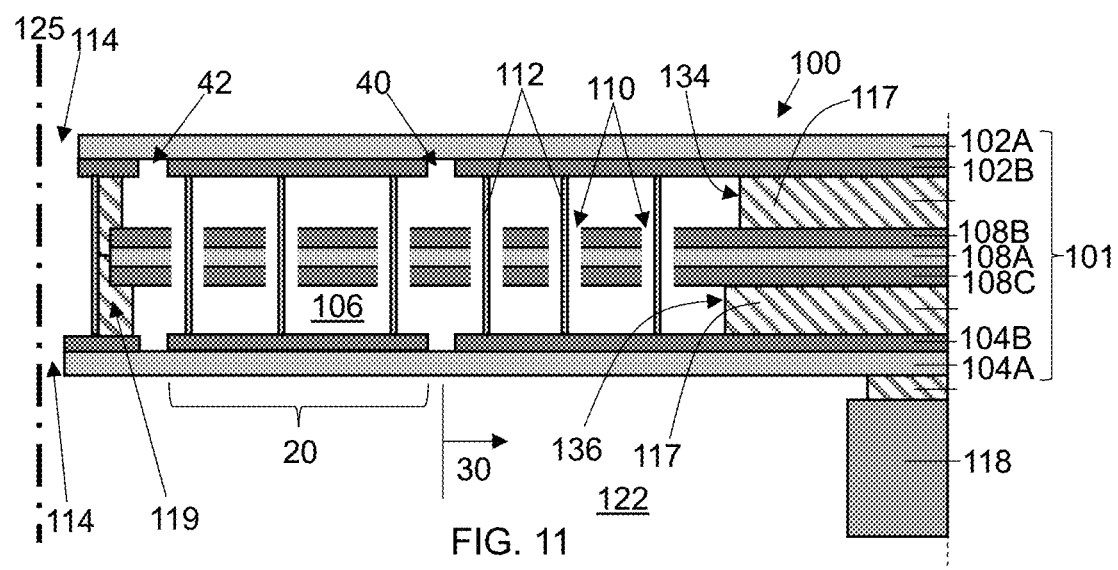
FIG. 11 is a cross-sectional schematic view of a MEMS die including a tunnel disposed through the MEMS diaphragm assembly, according to a further embodiment.

Referring to FIGS. 9-11, in some embodiments the MEMS diaphragm assembly 101 further includes a tunnel 114 that passes through at least a portion of the assembly 101. Referring to FIGS. 9 and 10, in an embodiment the MEMS diaphragm assembly 101 includes at least one tunnel 114 that passes through the first and second diaphragms 102, 104, and the stationary electrode assembly 108. In an embodiment the at least one tunnel 114 passes through the first and second diaphragms 102, 104 and the stationary electrode assembly 108, and the tunnel 114 is further sealed off from the sealed chamber 106. The tunnel 114 can be sealed off from the sealed chamber 106 by not passing through the sealed chamber 106 as illustrated in FIG. 9. In another embodiment, as illustrated in FIG. 10, the tunnel 114 passes through the sealed chamber 106 yet is sealed off from the sealed chamber 106. In an embodiment as illustrated in FIG. 11, the at least one tunnel 114 is sealed off from the sealed chamber 106 and passes through the sealed chamber 106 through the geometric center 125 of the assembly 101.

Still referring to FIGS. 9-11, in an embodiment the tunnel 114 is defined by a side wall 116 and in another embodiment at least a portion of the side wall 116 is surrounded by sacrificial material 117. The sacrificial material 117 can, for example, be made of any insulative material as described hereinabove. The pillars 112 and the side wall 116 can be made of any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof.

During operation of the MEMS die 100 described hereinabove, for example as an acoustic transducer 100, electric charge is applied to the conductive layers 108B and 108C of the stationary electrode assembly 108 and the sensing regions 20 of the first and second movable electrodes 102B and 104B thereby inducing an electric field between the stationary electrode(s) of the stationary electrode assembly 108 and the first and second movable electrodes 102B, 104B. Fluctuations in ambient pressure (e.g., resulting from sound waves) act against the outer surface of the diaphragm 104 facing the opening 122 causing the first and second diaphragms 102, 104 to deflect (enter a deflection state) and to deform. This deformation causes a change in the capacitance between the one or more stationary electrodes of the stationary electrode assembly 108 and the first and second diaphragms 102, 104, which can be detected and interpreted as sound.

Figure 12:
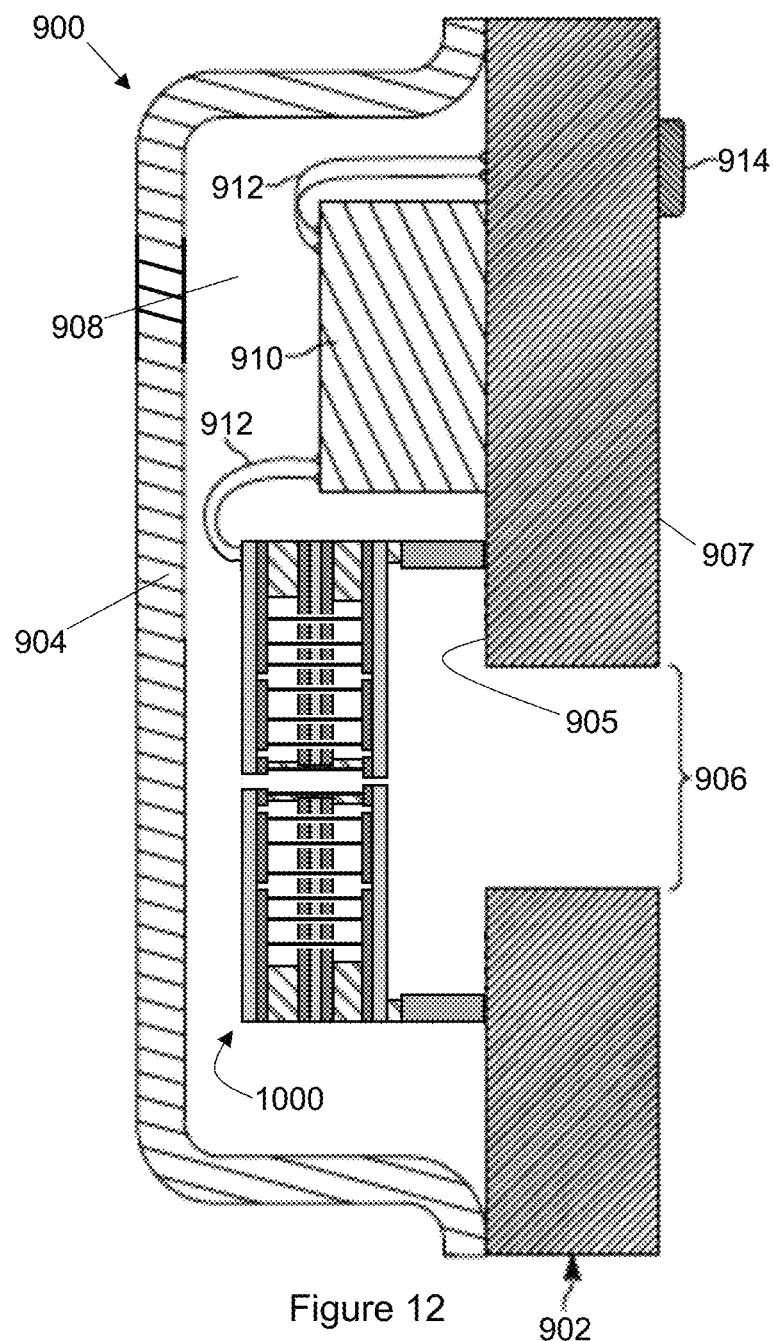
FIG. 12 is a cross-sectional view of a microphone assembly according to an embodiment.

Turning to FIG. 12, the MEMS die 100 used as an acoustic transducer 1000 is configured to fit within a microphone assembly, generally labeled 900. The assembly 900 includes a housing including a base 902 having a first surface 905 and an opposing second surface 907. The housing further includes a cover 904 (e.g., a housing lid), and an acoustic port 906. In an embodiment the port 906 extends between the first surface 905 and the second surface 907. In one implementation, the base 902 is a printed circuit board. The cover 904 is coupled to the base 902 (e.g., the cover 904 may be mounted onto a peripheral edge of the base 902). Together, the cover 904 and the base 902 form an enclosed volume 908 for the assembly 900. In an embodiment, for example, the MEMS die 100 used as an acoustic transducer 1000 includes a diaphragm assembly 101 as illustrated in FIG. 5A or 5B wherein the one of the first and second diaphragms 102, 104 having at least a portion thereof connected directly to the stationary electrode assembly 108 is the one of the first and second diaphragms 102, 104 disposed on a side of the diaphragm assembly 101 away from the opening 122. In another embodiment, for example, the MEMS die 100 used as an acoustic transducer 1000 includes a diaphragm assembly 101 as illustrated in FIG. 6A or 6B wherein the one of the first and second diaphragms 102, 104 having at least a portion thereof connected directly to the stationary electrode assembly 108 is the one of the first and second diaphragms 102, 104 disposed on a side of the diaphragm assembly 101 facing from the opening 122.

As shown in FIG. 12, the acoustic port 906 is disposed on the base 902 and is structured to convey sound waves and/or otherwise be acoustically coupled to the MEMS die 100 used as an acoustic transducer 1000 located within the enclosed volume 908. In other implementations, the acoustic port 906 is disposed on the cover 904 and/or a side wall of the cover 904, but is still acoustically coupled to the MEMS die 100. In an embodiment, the MEMS diaphragm assembly 101 of the MEMS acoustic transducer 1000 is oriented relative to the opening 122 such that one of the first and second diaphragms 102, 104 having at least a portion thereof connected directly to the stationary electrode assembly 108 is disposed on a side of the diaphragm assembly 101 facing away from the opening 122. In another embodiment, the MEMS diaphragm assembly 101 of the MEMS acoustic transducer 1000 is oriented relative to the opening 122 such that one of the first and second diaphragms 102, 104 having at least a portion thereof connected directly to the stationary electrode assembly 108 is disposed on a side of the diaphragm assembly 101 facing toward the opening 122.

In some embodiments, the assembly 900 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 900 includes an electrical circuit disposed within the enclosed volume 908. In an embodiment, the electrical circuit includes an integrated circuit (IC) 910. In an embodiment the IC 910 is disposed on the first surface 905 of the base 902. The IC 910 may be an application specific integrated circuit (ASIC). Alternatively, the IC 910 may include a semiconductor die integrating various analog, analog-to-digital, and/or digital circuits. In an embodiment the cover 904 is disposed over the first surface 905 of the base 902 covering the MEMS acoustic transducer 1000 and the IC 910.

In the assembly 900 of FIG. 12, the MEMS acoustic transducer 1000 is illustrated as being disposed on the first surface 905 of the base 902. The MEMS acoustic transducer 1000 converts sound waves, received through acoustic port 906, into a corresponding electrical microphone signal, and generates an electrical signal (e.g., a voltage) at a transducer output in response to acoustic activity incident on the port 906. As shown in FIG. 12, the transducer output includes a pad or terminal of the transducer that is electrically connected to the electrical circuit via one or more bonding wires 912. The assembly 900 of FIG. 12 further includes electrical contacts, shown schematically as contacts 914, typically disposed on a bottom surface of the base 902. The contacts 914 are electrically coupled to the electrical circuit. The contacts 914 are configured to electrically connect the assembly 900 to one of a variety of host devices.

As noted hereinabove, a plurality of MEMS devices can be manufactured in a single batch process. Individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes as an acoustic transducer or other portion of a microphone.

Steps in a production process utilized to produce the MEMS die 100 as described hereinabove include etching, masking, patterning, cutting, boring, and/or release steps executed on a workpiece. All of the steps are not described in detail herein. However, generally the portions of the MEMS die 100 that ultimately end up as the structure of the vacuum sealed dual diaphragms and the one or more tunnels 114 are layered onto a workpiece using sacrificial material, or otherwise bored or etched out of a solid block of material.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) diaphragm assembly comprising:
    a first diaphragm;
    a second diaphragm; and
    a stationary electrode assembly spaced between the first and second diaphragms and including a plurality of apertures disposed therethrough;
    wherein a plurality of pillars each disposed through one of the plurality of apertures connects the first and second diaphragms; and
    wherein at least one of the first and second diaphragms is connected to the stationary electrode assembly at a geometric center of the assembly.

2. The MEMS diaphragm assembly of claim 1, wherein both of the first and second diaphragms are connected to the stationary electrode assembly at the geometric center of the assembly.

3. The MEMS diaphragm assembly of claim 1, wherein the at least one of the first and second diaphragms is connected to the stationary electrode assembly at a geometric center of the assembly by an electrically insulative material.

4. The MEMS diaphragm assembly of claim 1, wherein the at least one of the first and second diaphragms is connected to the stationary electrode assembly at a geometric center of the assembly by an electrically conductive material.

5. The MEMS diaphragm assembly of claim 1, wherein at least a portion of the at least one of the first and second diaphragms is connected directly to the stationary electrode assembly.

6. The MEMS diaphragm assembly of claim 5, wherein at least a portion of one of the first and second diaphragms is connected directly to the stationary electrode assembly, and wherein the other of the first and second diaphragms is connected to the stationary electrode assembly by an electrically insulative material.

7. The MEMS diaphragm assembly of claim 5, wherein at least a portion of one of the first and second diaphragms is connected directly to the stationary electrode assembly, and wherein the other of the first and second diaphragms is connected to the stationary electrode assembly by an electrically conductive material.

8. The MEMS diaphragm assembly of claim 5, wherein at least a portion of both of the first and second diaphragms is connected directly to the stationary electrode assembly.

9. The MEMS diaphragm assembly of claim 1, wherein the first diaphragm and the second diaphragm bound a sealed chamber, and wherein the pressure within the sealed chamber is below atmospheric pressure.

10. The MEMS diaphragm assembly of claim 9, wherein at least one tunnel passes through the first and second diaphragms and the stationary electrode assembly, wherein the at least one tunnel is sealed off from the sealed chamber.

11. The MEMS diaphragm assembly of claim 10, wherein the at least one tunnel passes through the sealed chamber.

12. The MEMS diaphragm assembly of claim 10, wherein the at least one tunnel passes through the geometric center of the assembly.

13. The MEMS diaphragm assembly of claim 1, wherein at least one tunnel passes through the first and second diaphragms and the stationary electrode assembly.

14. A microphone device, comprising:
    a MEMS die, comprising:
        the MEMS diaphragm assembly of claim 1; and
        a substrate having an opening formed therethrough;
        wherein the diaphragm assembly is attached around the outer periphery thereof to the substrate and over the opening; and
    a housing having a sound port, wherein the MEMS die is disposed within the housing, and wherein the sound port is acoustically coupled to the MEMS die.

15. A microelectromechanical systems (MEMS) diaphragm assembly comprising:
    a first diaphragm;
    a second diaphragm; and
    a stationary electrode assembly spaced between the first and second diaphragms, the stationary electrode assembly including a plurality of apertures disposed therethrough, the plurality of apertures including a central aperture disposed through a geometric center of the stationary electrode assembly;
    wherein a plurality of pillars is each disposed through one of the plurality of apertures except for the central aperture, wherein the plurality of pillars connects the first and second diaphragms; and
    wherein the first and second diaphragms are connected directly to one another within the central aperture.

16. A microphone device, comprising:
    a microelectromechanical system (MEMS) die, comprising:
        a substrate having an opening formed therethrough; and
        a diaphragm assembly attached around a periphery thereof to the substrate and over the opening, wherein the diaphragm assembly comprises:
            a first diaphragm;
            a second diaphragm; and
            a stationary electrode assembly spaced between the first and second diaphragms and including a plurality of apertures disposed therethrough;
            wherein a plurality of pillars each disposed through one of the plurality of apertures connects the first and second diaphragms; and
            wherein at least one of the first and second diaphragms is connected to the stationary electrode assembly at a geometric center of the assembly; and
    a housing having a sound port, wherein the MEMS die is disposed within the housing, and wherein the sound port is acoustically coupled to the MEMS die.

17. The microphone device of claim 16, wherein at least a portion of the at least one of the first and second diaphragms is connected directly to the stationary electrode assembly.

18. The microphone device of claim 17, wherein the one of the first and second diaphragms having at least a portion thereof connected directly to the stationary electrode assembly is the one of the first and second diaphragms disposed on a side of the diaphragm assembly away from the opening.

19. The microphone device of claim 16, wherein both of the first and second diaphragms are connected to the stationary electrode assembly at the geometric center of the assembly.

20. The microphone device of claim 16, wherein at least one tunnel passes through the first and second diaphragms and the stationary electrode assembly.

* * * * *